(12) United States Patent
Skergan et al.

(10) Patent No.: US 6,539,491 B1
(45) Date of Patent: Mar. 25, 2003

(54) METHOD AND APPARATUS FOR IMPLEMENTING IEEE 1149.1 COMPLIANT BOUNDARY SCAN

(75) Inventors: Timothy M. Skergan, Austin, TX (US); Johnny J. LeBlanc, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/436,111

(22) Filed: Nov. 8, 1999

(51) Int. Cl.[7] .............................................. G06F 1/04
(52) U.S. Cl. .................................... 713/500; 713/600
(58) Field of Search .............................. 713/500, 501, 713/600; 714/724, 726, 727

(56) References Cited

U.S. PATENT DOCUMENTS

| | | | |
|---|---|---|---|
| 5,519,714 A | * | 5/1996 | Nakamura et al. .......... 714/726 |
| 5,726,999 A | | 3/1998 | Bradford et al. ......... 371/22.32 |
| 5,732,091 A | | 3/1998 | Whetsel ..................... 371/22.3 |
| 5,740,181 A | * | 4/1998 | Heikes et al. ............... 714/731 |
| 5,847,561 A | | 12/1998 | Whetsel ................... 324/158.1 |
| 5,859,860 A | | 1/1999 | Whetsel .................... 371/22.32 |
| 5,864,564 A | * | 1/1999 | Levitt et al. ................. 327/156 |
| 5,887,001 A | | 3/1999 | Russell .................... 371/22.31 |
| 6,014,752 A | * | 1/2000 | Hao et al. .................... 713/500 |
| 6,055,649 A | * | 4/2000 | Deao et al. .................... 714/30 |

* cited by examiner

*Primary Examiner*—Dennis M. Butler
(74) *Attorney, Agent, or Firm*—Duke W. Yee; Volel Emile; Vincent J. Allen

(57) ABSTRACT

A method and apparatus for pipelining clock control signals across a chip. The present invention avoids the need for multiple clock distribution systems by allowing clock controls for clock stopping, scanning, and debugging to be distributed to all local clock buffers through pipelined non-scan latches. The test control pipeline latches may be routed along with the clock through the clock receiver, the central clock buffer, and the sector buffer areas of the chip. A relatively low speed testing mechanism may be used to drive the testing of the chip externally. The test clock is synchronized with a free-running clock on the chip to allow the circuit to be operated at speed during the testing of the chip. During boundary scan, the pipelined controls are forced to static levels which are active levels for scanning. Non-pipelined signals control the boundary scan operation based directly on the TCK clock defined in the IEEE 1149.1 boundary scan standard.

9 Claims, 10 Drawing Sheets

US 6,539,491 B1

METHOD AND APPARATUS FOR IMPLEMENTING IEEE 1149.1 COMPLIANT BOUNDARY SCAN

BACKGROUND OF THE INVENTION

1. Technical Field

The present invention relates to clock signal control for integrated circuits, and more particularly, to a method and system for complying with IEEE boundary scan standards.

2. Description of Related Art

During the manufacture of digital integrated circuits, it is essential that the integrated circuit be tested to ensure that it matches the functional specification and that only defect-free production chips are packaged and shipped to the customer. After the chips have been manufactured, an external testing machine may be used to determine whether there are any defects in the chip. As the density of circuitry on a chip continues to increase with advances in technology and as the number of input/output pins remains small, testing becomes more complex and more costly.

Today, design for testing is a large portion of the chip design. Certain portions of the chip may be dedicated only for testing. Level-Sensitive Scan Design (LSSD) is a design technique used for designing test circuits on a chip. LSSD imposes strict rules on clock signal usage to allow the implementation of sequential scan latches for testing the circuit. LSSD is commonly known in the art and provides rigid clocking rules in order to prevent data input to the scan latches from changing while the clock pulse is transitioning. Thus, the digital circuit is comprised of two sections: (1) a combinational circuit; and (2) a set of sequential scan latches used to test the circuit. The latches are used such that during testing the value of each latch may be individually controlled and observed by shifting (i.e., scanning) a serial vector consisting of a number bits into or out of the scan latch. Because the latches inside the circuit are effectively input/output terminals, the testing of the circuit is simplified while maintaining a small number of input-output pins on the chip. The LSSD technique allows more inputs/outputs for testing the circuit than are actually available at the boundary of the chip.

When using LSSD techniques, it is necessary to supply a test clock and test controls to operate the chip in a test mode. Currently, a separate clock distribution system is used to distribute the clock and control signals to the scan latches. Thus, instead of having only one H-tree clock distribution system, for example, the integrated circuit contains at least two H-tree clock distribution systems. One is for the high-performance clock which is used to drive the functional or dynamic logic on the chip, and one is used to drive the test logic.

It is desirable to test a chip "at speed," i.e., the normal operating speed of the chip. When tested in this manner, defects which only arise at the normal operating speed of the chip can be detected by the test circuitry. The problem with testing the chip at speed is that as clock speeds increase on chips, the complex balancing of timing between the system clock tree and the test clock tree becomes even more difficult and costly. Furthermore, the expensive testing equipment currently used to test the chips cannot be operated at the same speed as the system clock. Thus, the chip must be tested in the manufacturing environment at a speed lower than that at which it would normally operate. The problem with testing at a lower speed is that all of the defects in the chip may not show up at the lower test speed. Therefore, the customer may actually be the first one to learn of a defect when the chip is put into operation.

One method of testing which uses sequential scan latches is referred to as "boundary scan testing." This form of testing is well known in the art and is supported by an IEEE standard (IEEE 1149.1) which details the implementation and operation of boundary scan testing. Boundary scan is used for testing the board-level interconnections among the components on a printed circuit board. Boundary scan is a special type of scan path testing which is implemented around every input/output pin in order to control and provide access to the pin values during testing. During the design for testing, the rules of 1149.1 must be incorporated into the design in order to comply with the standard. As technology advances, it becomes more and more difficult to comply with 1149.1 because many of the rules in the standard were developed based on the technology in existence at the time.

Thus, a method and system for testing is needed which allows an integrated circuit to be tested at speed while also allowing the expensive test equipment which is currently in use to be utilized to perform such testing. It is also desirable to require only one tightly tuned high speed clock distribution system because of the added complexity and increased wiring that results from the use of multiple clock distribution systems. Furthermore, the resulting method and system should be compatible with the IEEE 1149.1 boundary scan standard.

SUMMARY OF THE INVENTION

The present invention avoids the need for multiple clock distribution systems by allowing clock controls for clock stopping, scanning, and debugging to be distributed to all local clock buffers through pipelined non-scan latches. The test control pipeline latches may be routed along with the clock through the clock receiver, the central clock buffer, and the sector buffer areas of the chip. A relatively low speed testing mechanism may be used to drive the testing of the chip externally. The test clock is synchronized with a free-running clock on the chip to allow the circuit to be operated at speed during the testing of the chip. During boundary scan, the pipelined controls are forced to static levels which are active levels for scanning. Non-pipelined signals control the boundary scan operation based directly on the TCK clock defined in the IEEE 1149.1 boundary scan standard. The topology of the boundary scan cell is configured such that the capturing of the chip inputs is through the scan port.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
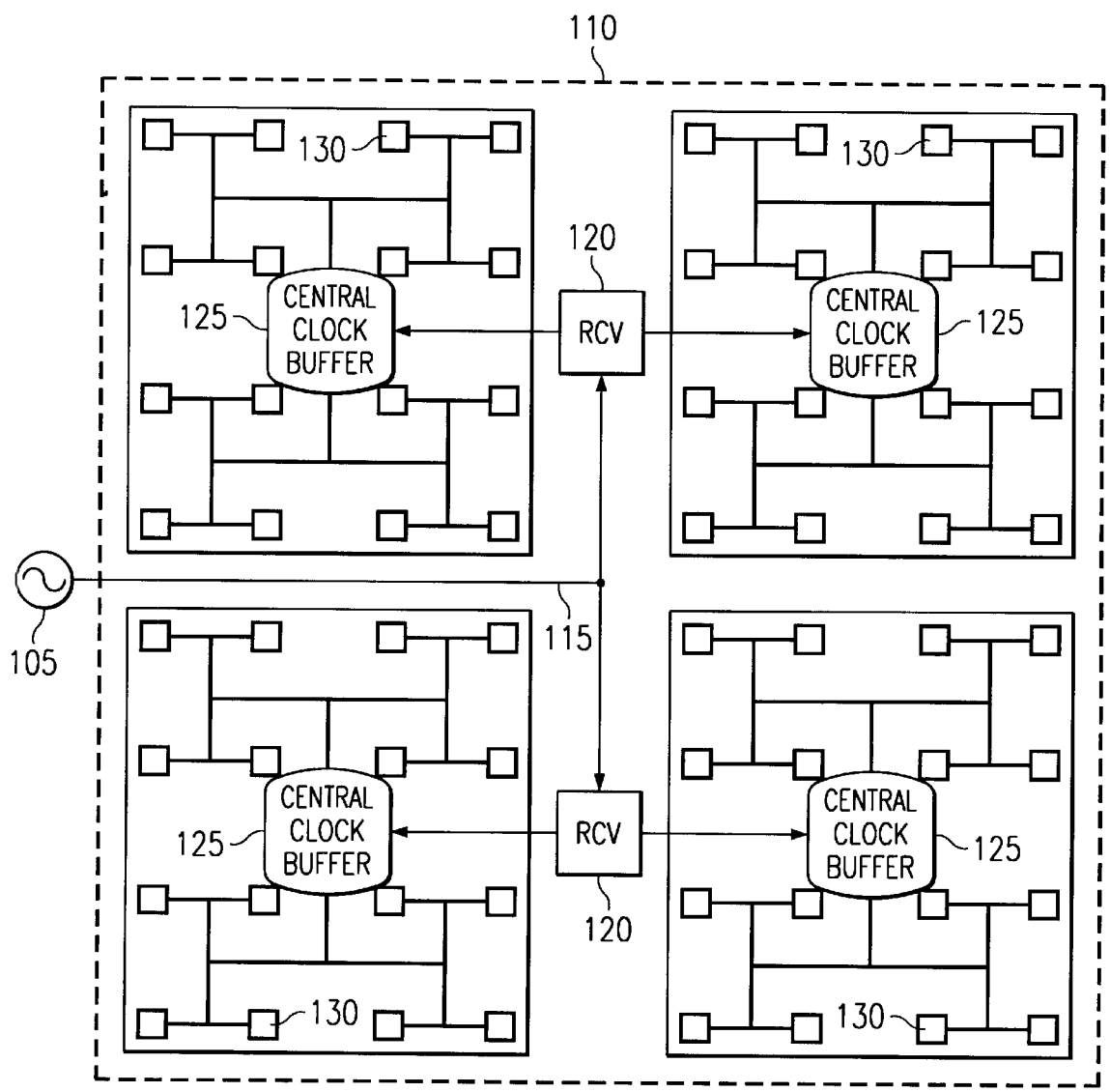
FIG. 1 is a schematic diagram of a clock distribution system in a preferred embodiment of the present invention.

Referring now to FIG. 1, a schematic diagram of a clock distribution system in a preferred embodiment of the present invention is shown. A clock source 105 is input into chip 110 from an oscillator source such as a saw-tooth wave generator or a phase-locked loop type clock source by way of wiring 115 on the chip. This oscillator signal is input into two receiver circuits 120. Receiver circuits 120 each drive two central clock buffers 125. Each clock buffer 125 in turn drives an H-tree that terminates with 16 sector buffers 130 used to re-power the clock signal. Each sector buffer 130 then drives a secondary H-tree (not shown) which terminates onto a single clock mesh (not shown), also called a clock grid, covering the entire chip area. The clock mesh is a series of vertical and horizontal low resistive wires that short together the outputs of all the clock buffers of the secondary H-tree, thus minimizing clock skew across the chip.

The clock mesh serves as the clock reference point (mclk) for the chip. The mclk signal is a "free-running" clock signal in that the clock never stops unless there is a problem with the clock source or distribution system. Devices such as latches, dynamic logic, and RAMs tap onto the mesh through local clock buffer circuits which are attached to the mesh. Some devices also connect directly to the mesh without being gated by a local clock buffer. The present invention is not limited to the method described here for distributing the "free-running" clock. One skilled in the art will recognize that other methods of distributing the clock may be implemented without departing from the scope and spirit of the invention.

Figure 2:
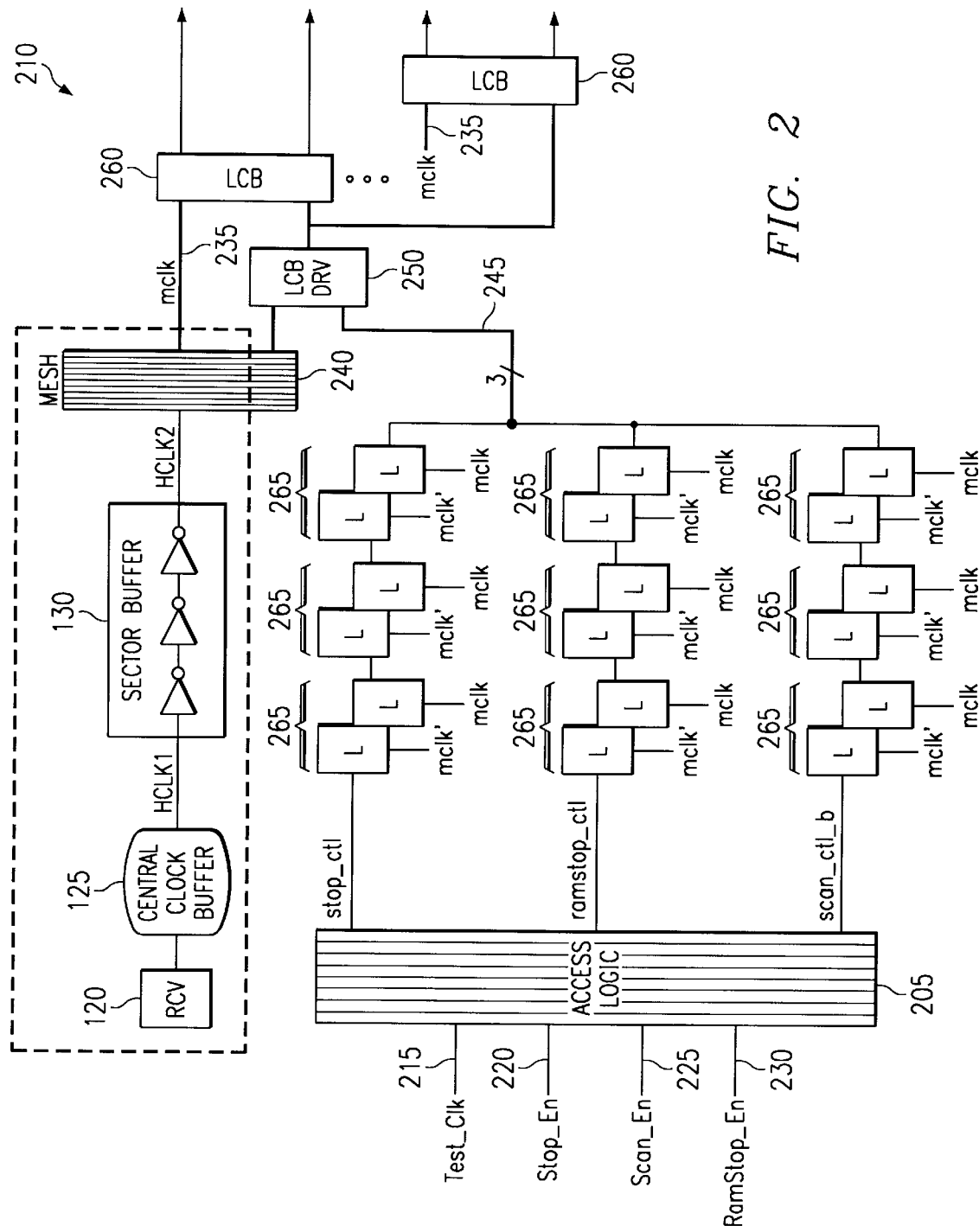
FIG. 2 is a schematic diagram of a preferred embodiment of the present invention.

Referring now to FIG. 2, a schematic diagram of a preferred embodiment of the present invention is shown. Throughout this description, identical numerals are used in the figures to denote like components. A tester is used to provide primary inputs to access logic 205. The test equipment is external to chip 210. The test signals which are input to the access logic on the chip are Test_Clk 215, Stop_En 220, Scan_En 225, and RAMStop_En 230. Access logic 205 is used both to synchronize Test_Clk 215 with mesh clock signal (mclk) 235, and to generate a pulse of the same width as a period of the mesh clock. The particular logic used in access logic 205 is described in further detail with reference to FIG. 3 below. The clock controls Stop_En 220, Scan_En 225, and RAMStop_En 230 may be conveniently propagated through the chip parallel to the path of the clock distribution system. However, one skilled in the art will recognize that other fanout schemes may be used.

The purpose of clock controls 220, 225, and 230 is to control the internal scanning and clocking of the chip when in a test mode. In a preferred embodiment, Stop_En 220 is used to prevent the mesh clock from clocking the functional devices of the circuit while in the LSSD test mode. Whenever Stop_En 220 is low, a system clock pulse is generated at the output of the local clock buffer for each rising edge of Test_Clk 215. Test_Clk 215 is the LSSD test clock that is sourced by the manufacturing tester under the control of test patterns. When not in the test mode, Stop En_220 is always high and the mesh clock propagates through local clock buffers 260 ungated.

Scan_En 225 is a clock control signal used to enable serial shifting of the LSSD scan chains in the chip. When Scan_En 225 is asserted, one serial shift clock pulse is generated for each rising edge of Test_Clk 215. The shift clock pulse causes the shift register in the LSSD chain to shift one bit. RAMStop_En 230 is a clock control signal which is similar in effect to Stop_En 220 except that the effect is to force the chip memory array clocks offline whenever the signal is asserted. When RAMStop_En 230 is low, an array clock pulse is generated for each rising edge of Test_Clk 215. In normal operation, RAMStop_En 230 is high.

The frequency of Test_Clk 215 from the external tester has a much lower frequency than the mesh clock. Depending on the speed of the tester and the speed of the circuit being tested, the test clock may be more than 80 times slower than the mesh clock, but at a minimum it must be two times slower to allow the synchronizers within access logic 205 time to generate a pulse. In the case where a test clock speed equal to the mesh clock is required, the synchronizers within access logic 205 are bypassed. The control signals 220, 225 and 230 are used to gate the mesh clock at the local clock buffers of all the latches on the chip except for logic which must be connected directly to the mesh clock.

When operating in a test mode, it is necessary to distribute the clock controls to various locations on the chip. In a preferred embodiment, the clock controls are piped alongside the normal clock distribution of the chip through each clock receiver 120, through each central clock buffer 125, through each sector buffer 130, to each local clock buffer driver 250. However, the clock controls are not physically connected to the clock distribution system for controlling the clock until the controls reach a local clock buffer 260. In a preferred embodiment of the present invention, there are anywhere from 20 to 80 local clock buffer drivers 250. From each local clock buffer driver 250 there are a total of 16 local clock buffers 260. Local clock buffers 260 are used to drive latches, dynamic logic, RAMs, and other functional parts on the chip including scan latches used for testing. There may be thousands of latches present on a given chip.

Pipelining the clock control signals through latches is necessary for today's high speed chips. The maximum distance that an electrical signal can travel with optimal buffering within one mesh clock period is approximately 10,000 wiring tracks. Because the "manhattan distance," i.e., the distance from the chip center to chip corner is 60,000 wiring tracks, the control signals cannot be distributed directly to the various parts of the chip within one clock period. Latch pairs 265 are used to pipeline the clock controls from access logic 205 to the local clock buffers 260 and are clocked directly from mesh clock 240. The first latch in a pair 265 is referred to as the "master" latch and is gated by the falling edge of mclk 235. The second latch in the pair is referred to as the "slave" latch and is gated by the rising edge of mclk 235. Thus, the number of mclk 235 cycles needed for a clock control signal to propagate from access logic 205 to local clock buffer 260 is determined by the number of latch pairs between access logic 205 and local clock buffer 260. The number of latch stages that are chosen for a particular design is not important to the present invention. However, the number of latches chosen should be such that the delays to all of the local clock buffers caused by the pipelining of the control signals are the same regardless of the distance from access logic 205. When the circuit is constructed in this manner, the control signals reach each local clock buffer on the chip during the same cycle of mclk 235. Because Test_Clk 215 runs at a much slower frequency than mclk 235, the pipelining has no effect on the operation of the external tester. This enables the tester to be used as if it is running at the same speed as mclk 240.

Figure 3:
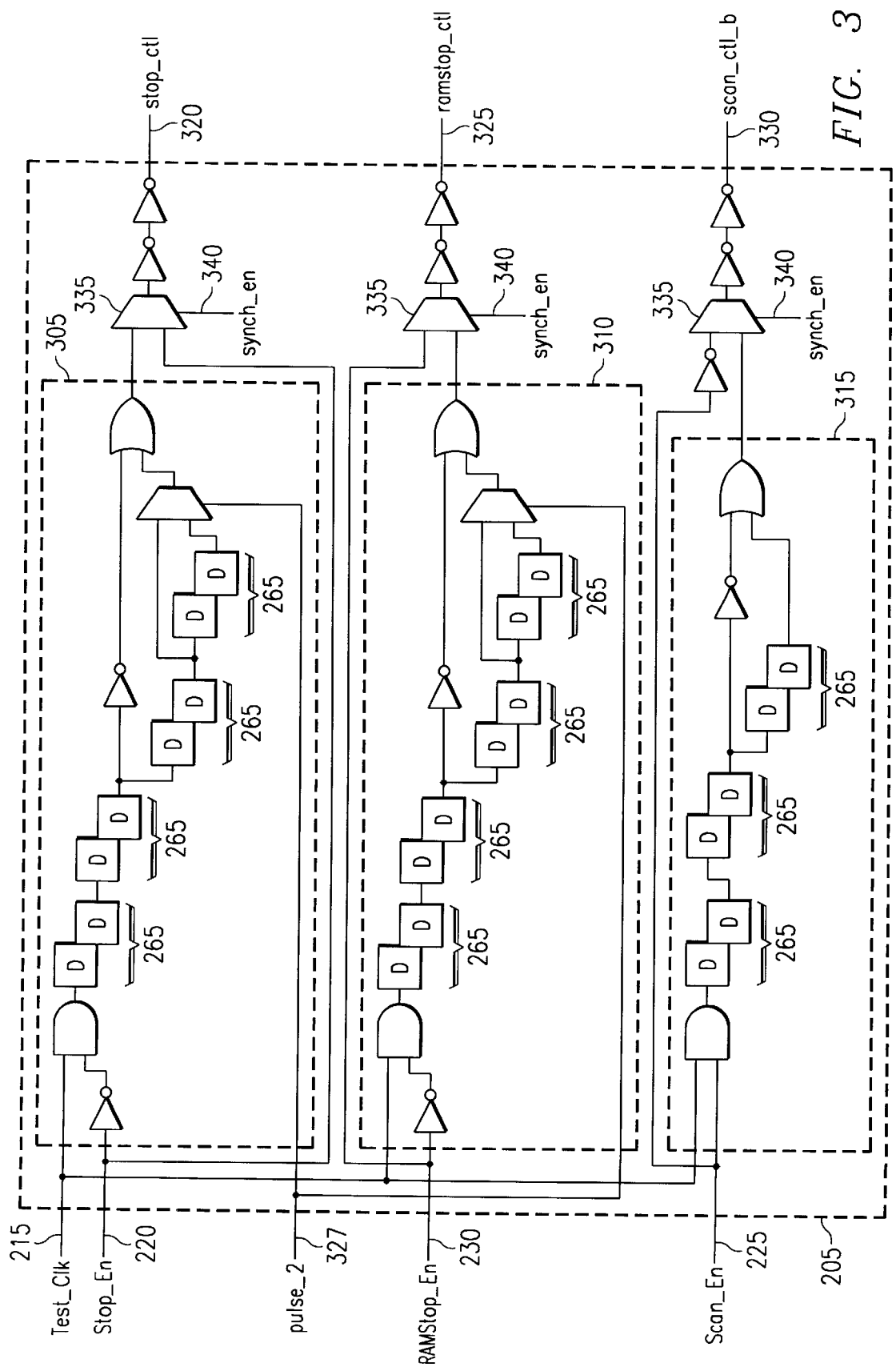
FIG. 3 is a schematic diagram of an embodiment of the access logic shown in FIG. 2 as shown in greater detail.

Referring now to FIG. 3, a schematic diagram of an embodiment of access logic 205 of FIG. 2 is shown in greater detail. The primary inputs from the external tester are input into access logic 205. The primary inputs are Test_Clk 215, Stop_En 220, RAMStop_En 230, and Scan_En 225. Synchronizers 305, 310, 315 within the access logic 205 represent separate modules for synchronizing Test_Clk 215 with mesh clock 240 and for generating a pulse representing the corresponding control signal 220, 225, 230 that is input into access logic 205.

Stop_En 220 and RAMStop_En 230 are both active low signals, meaning that when the signal is low a pulse is generated at the output of the synchronizer on the rising edge of Test_Clk 215. Thus, if Stop_En 220 is low on the leading edge of Test_Clk 215, then the output of access logic 205 at stop_ctl ctl 320 is a pulse which is active low. Similarly, if RAMStop_En 230 is low on the leading edge of Test_Clk 215, then an active low pulse is generated at ramstop_ctl 325. Scan_En 225 on the other hand is active high. Thus, whenever Scan_En 225 is high on the leading edge of Test_Clk 215, the output of access logic 205 at scan_ctl_b 330 is a pulse which is active low.

When the chip is operating in the test mode, the rising edge of Test_Clk 215 triggers a pulse at the outputs of access logic 205 depending on which clock control signals 220, 225, 230 are asserted. For example, consider a case where RAMStop_En 230 is logically false, that is in a non-enabled condition where the control signal is not forcing the RAM clocks to be stopped. In this case, while Test_Clk 215 is on a rising edge, a pulse is generated at the output ramstop_ctl 325 which permits a single system clock of the RAMS when the pulse reaches the end of the clock control pipeline.

The pulse width at the outputs 320, 325, 330 of access logic 205 is much smaller than the pulse width of Test_Clk 215 because mesh clock 240 is running at a much higher frequency. Mesh clock 240 is used to clock the latch pairs 265 that are shown in synchronizers 305, 310, 315. In order to allow two or more back-to-back, or contiguous, high speed system clocks to the latches, the turning off of a clock control pulse may be selectively delayed one or more clock cycles by adding additional pipeline latches in the leg of the synchronizers 305, 310 that shuts off the pulse. The number of cycles that the pulse width is elongated is selectable from test pins into the chips. Typically, these "pulse width" select pins are shared with functional inputs. In FIG. 3, pulse_2 327 is used to elongate the pulse. Pulse_2 is shared with a functional pin in order to reduce the number of dedicated test pins on the chip package.

A multiplexer 335 is used on the output of each of synchronizers 305, 310, 315 to select between either the output of the respective synchronizer 305, 310, 315 or a direct connection to the respective primary inputs 220, 225, 230. When the free-running mesh clock is operable, sync_en 340 is set active to select the output from synchronizers 305, 310, 315. The synchronizing feature of the invention would not be used, for example, when the chip is in a brain-dead mode. In other words, if the free-running oscillator clock on the mesh is non-functional, the test clock may be used to directly drive the H-tree mesh and there would be no need to synchronize the test clock with the mesh clock.

Figure 4:
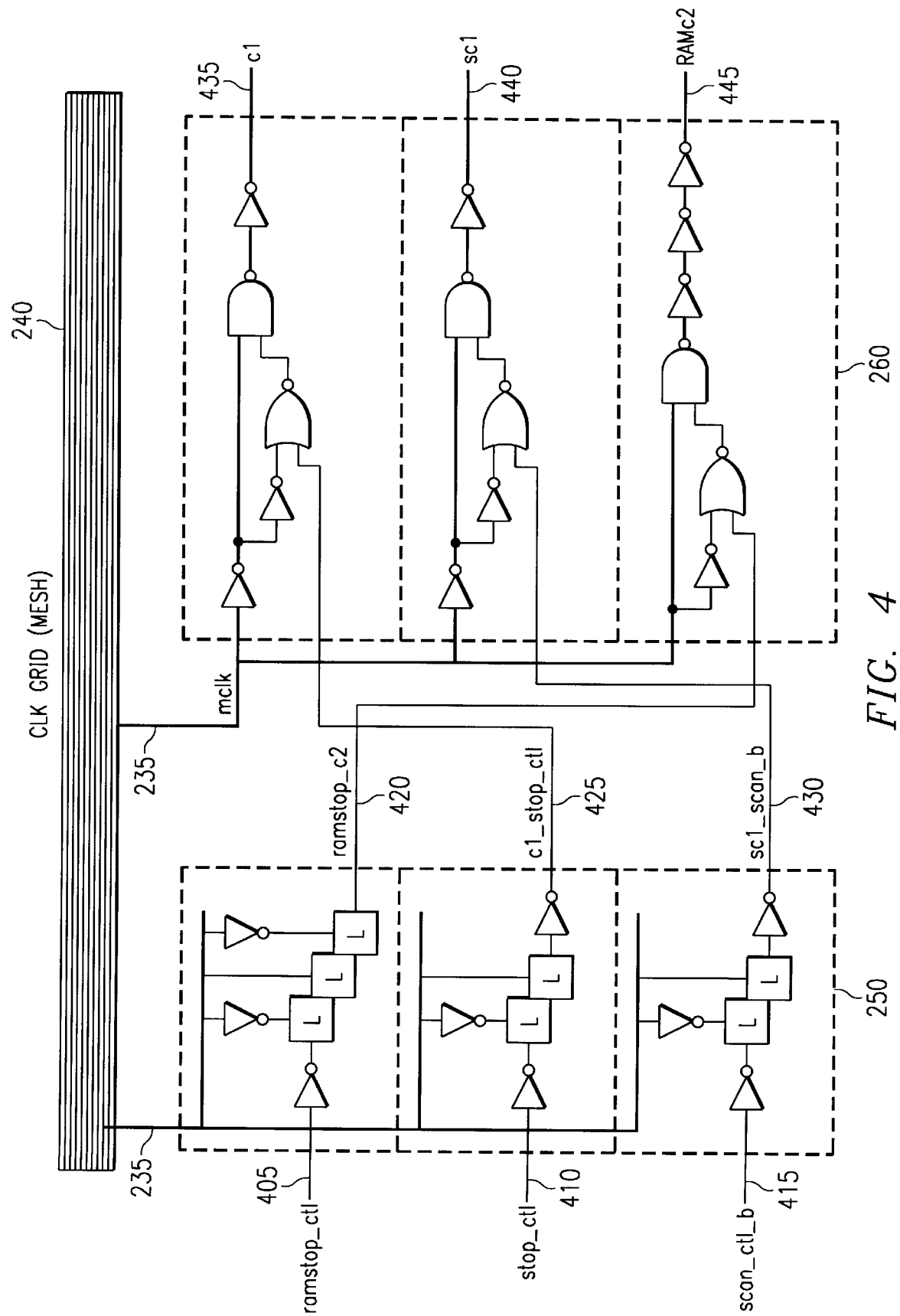
FIG. 4 is a schematic diagram illustrating the local clock buffer driver 250 and the local clock buffer 260 of FIG. 2 in greater detail.

Referring now to FIG. 4, a schematic diagram illustrating local clock buffer driver 250 and local clock buffer 260 of FIG. 2 in greater detail is shown. The logic shown is limited to that necessary for understanding the invention. However, local clock buffer driver 250 and local clock buffer 260 may include additional logic and control inputs for operating in different modes. The control signals ramstop_ctl 405, stop_ctl 410, and scan_ctl_b 415 are all input into local clock buffer driver 250 from the end of the pipeline of non-scan latches through which they were distributed across the chip. Within the local clock buffer driver 250, control signals 405, 410, 415 are amplified and sent through additional latch pairs and are output to local clock buffer 260 which are driven by the local clock buffer driver 250. At the output of local clock buffer driver 250, ramstop_ctl 405 is represented as ramstop_c2 420. Stop_ctl 410 becomes c1_stop_ctl 425 and scan_ctl_b 415 becomes sc1_scan_b 430. The designation of the signal will become important later in reference to the timing diagram shown in FIG. 5.

As long as c1_stop_ctl 425 remains high, the output c1 of local clock buffer 260 remains low. However, when a pulse is generated by the pulse generator and synchronizer of access logic 205 of FIG. 2, one pulse of the mesh clock is allowed to output c1 435. The output c1 435 may be connected to various logical devices on the chip. Similarly, when sc1_scan_b 430 is pulsed, an output pulse is seen at sc1 440. For example, the sc1 signal may be connected to a scannable latch on the chip. Similarly, when a pulse is received at ramstop_ctl 405, a pulse is generated at ramstop_ctl c2 420. This causes a pulse to be generated at RAM_c2 445. The width of all of the pulses is the same width as mesh clock 235.

The delay from the leading edge of Test_Clk 215 to the leading edge of the pulse that is generated at the output of the local clock buffer driver 250 is determined by the number of latches that exist in the non-scan pipeline. So, for example, if there are eight stages or pairs of latches between access logic 205 and the output of local clock buffer driver 260, then the delay between the leading edge of Test_Clk 215 and the pulse that is generated on the output will be approximately eight cycles of mesh clock 235.

Figure 5:
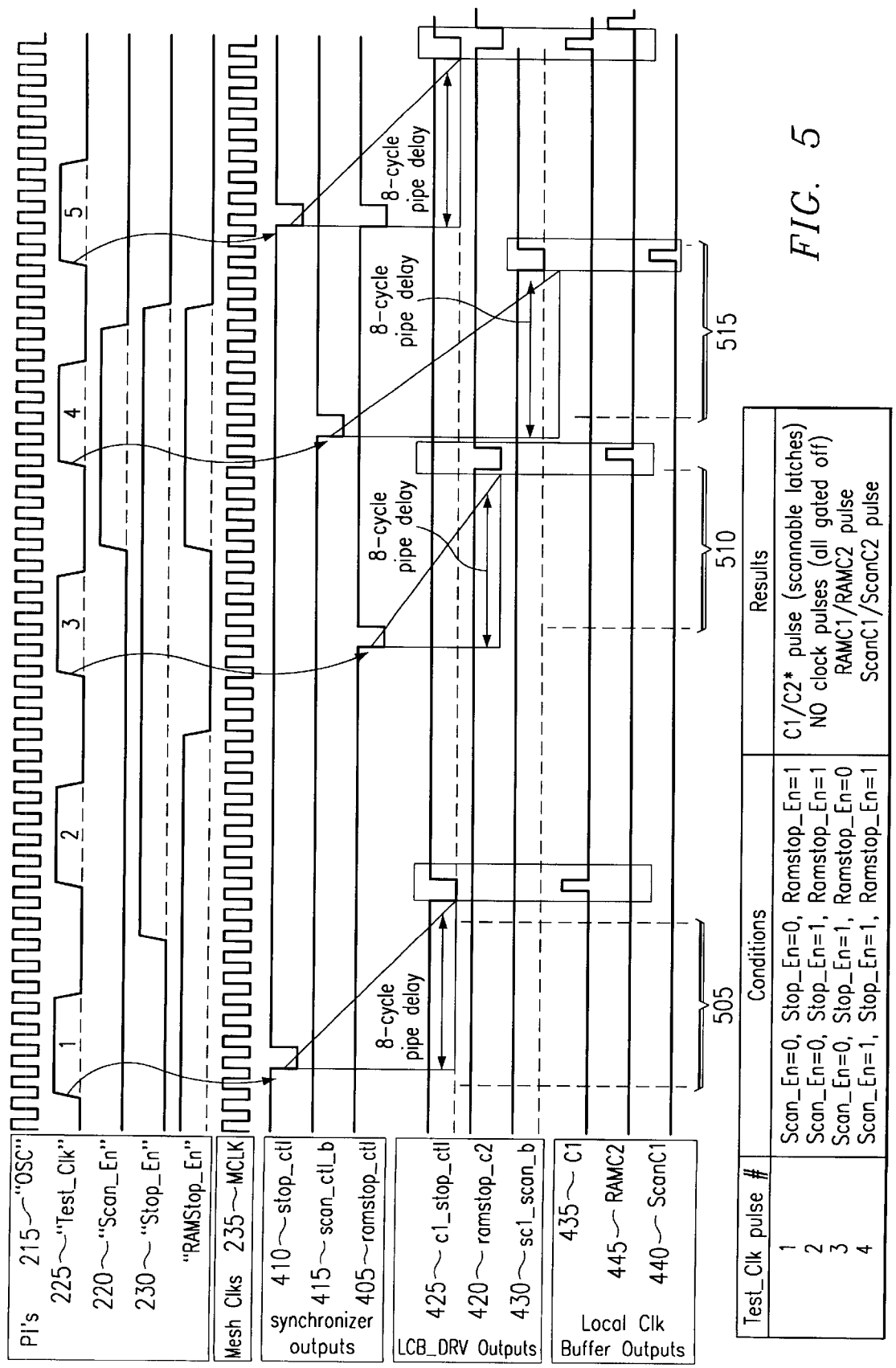
FIG. 5 is a timing diagram for the preferred embodiment of the invention shown in FIGS. 2–4.

Referring now to FIG. 5, a timing diagram for the operation of a preferred embodiment of the invention shown in FIGS. 2–4 is illustrated. The first line of the timing diagram labeled "OSC" shows that the free-running clock on the mesh is active. The timing diagram is shown for the situation in which the chip is in a test mode. The primary inputs Test_Clk 215, Scan_En 225, Stop_En 220, and RAMStop_En 230 are shown at the top of the diagram. Note that the mesh clock 235 is also shown and coincides with the free-running oscillator clock OSC.

During the first rising edge of Test_Clk 215, Scan_En 225 and Stop_En 220 are both low. RAMStop_En 230 is high. As previously described, Scan_En 225 is active high, whereas Stop_En 220 and RAMStop_En 230 are active low. Thus, the only signals which are active at the first rising edge of Test_Clk 215 is Stop_En 220. Because Stop_En 220 is low during the first rising edge of Test_Clk 215, a pulse is generated at output stop_ctl 410 of access logic 205. A pulse on stop_ctl 410 results in a pulse at output c1_stop_ctl 425 from the local clock buffer driver which is delayed in time by eight cycles of mesh clock 235.

The timing diagram of FIG. 5 is thus representative of the case where there are eight stages of pipeline latches for piping the control signals between the output of access logic 205 and the output of a local clock buffer driver. Eight latch stages are not shown in the previous schematics in order to avoid cluttering the figures. However, the timing diagram as shown here is based on eight stages of pipeline delay.

The pulse at the local clock buffer driver output c1_stop_ctl 425 then causes a pulse to be generated at local clock buffer output c1 435 which is equal in width to one mesh clock pulse and synchronous with the mesh clock. At the second rising edge of Test_Clk 215, no pulses are generated at the output of local clock buffer. The reason is that all of the clock control signals 220, 225, 230, are inactive. Thus, no clock pulses are generated. At the third rising edge of Test_Clk 215, RAMStop_En 230 is low. This results in a pulse being generated at output ramstop_ctl 405 of access logic 205. Eight cycles of mesh clock 235 later, a pulse is shown at output ramstop_ctl 420 of the local clock buffer driver. This results in a pulse being generated at the output RAMc2 445 of the local clock buffer. This pulse is also synchronous with and equal to the pulse width of mesh clock 235. At the fourth rising edge of Test_Clk 215, Scan_En 225 is active. Thus, a pulse is generated at output scan_ctl_b 415 of access logic 205. Eight cycles of mesh clock 235 later, a pulse is seen at output sc1 440 of the local clock buffer.

The advantage of using the pipelining method described above for sending control signals to various parts of the chip is that only one high speed clock source is needed for testing the chip. Furthermore, pipelining provides a mechanism for distributing the control signal across the chip without the need for complex timing considerations to be taken into account. Considerable engineering effort, analysis, and integration priority are focused on the distribution of the high speed clock in order to minimize the percentage of skew of the clock seen between two latches on the chip. Clock skew is introduced by variations in semiconductor properties introduced by the fabrication process as well as spatial and temporal variations in power supply voltages and temperatures. Pipelining the clock control signals through latches that are clocked by the high speed clock eliminates this complex timing analysis and design because the clock control signals simply propagate across latch boundaries synchronous with a clock, the single high speed clock. As long as the number of pipelining latch pairs from access logic 205 to each local clock buffer is equal, the delay to each local clock buffer will also be equal and the clock controls will gate, and likewise ungate, the high speed clock to all the latches on the same clock edge.

Furthermore, it has become physically impossible to distribute control signals across the chip to a local clock buffer without using pipelined latches because of the increased clock speeds coupled with increased density of current chips. As the density of a chip goes up, the width of the wiring on the chip decreases, causing resistance to go up. The time of propagation of electrical signals on silicon chips is bounded theoretically by the speed of light, but more practically by the time constant that is a function of wire resistance and capacitance. In order to propagate a signal across the largest semiconductor chips synchronously with the high speed clock, the signal must be pipelined through latches clocked by the high speed clock.

During a boundary scan mode of testing the integrated circuit, the free running oscillator is shut off and the test clock (TCK) defined in the IEEE 1149.1 standard, hereby incorporated by reference, is used to drive the main H-tree. Unlike in the normal scan mode described previously, the system clock may not be used in boundary scan because that would result in a violation of the IEEE 1149.1 standard. This creates a problem because the pipelines used to distribute clock control signals across the chip are no longer "invisible" because the test clock used in boundary scan is also used to drive the mesh. Thus, the latches in the pipeline are clocked by the test clock and not by a free running clock which is running at a much higher speed than the test clock.

Under the 1149.1 standard, output pin values can be controlled using values preloaded into the boundary scan register, and signals received on the input pins may be captured into the boundary-scan register and later shifted out of the register to be observed on an external tester. Test control signals provided by an on-chip controller called the Test Access Port (TAP) controller are used to disable the boundary scan cells during regular system operation to allow signal values to flow into/out of the integrated circuit component without interference by the test circuits.

Figure 6:
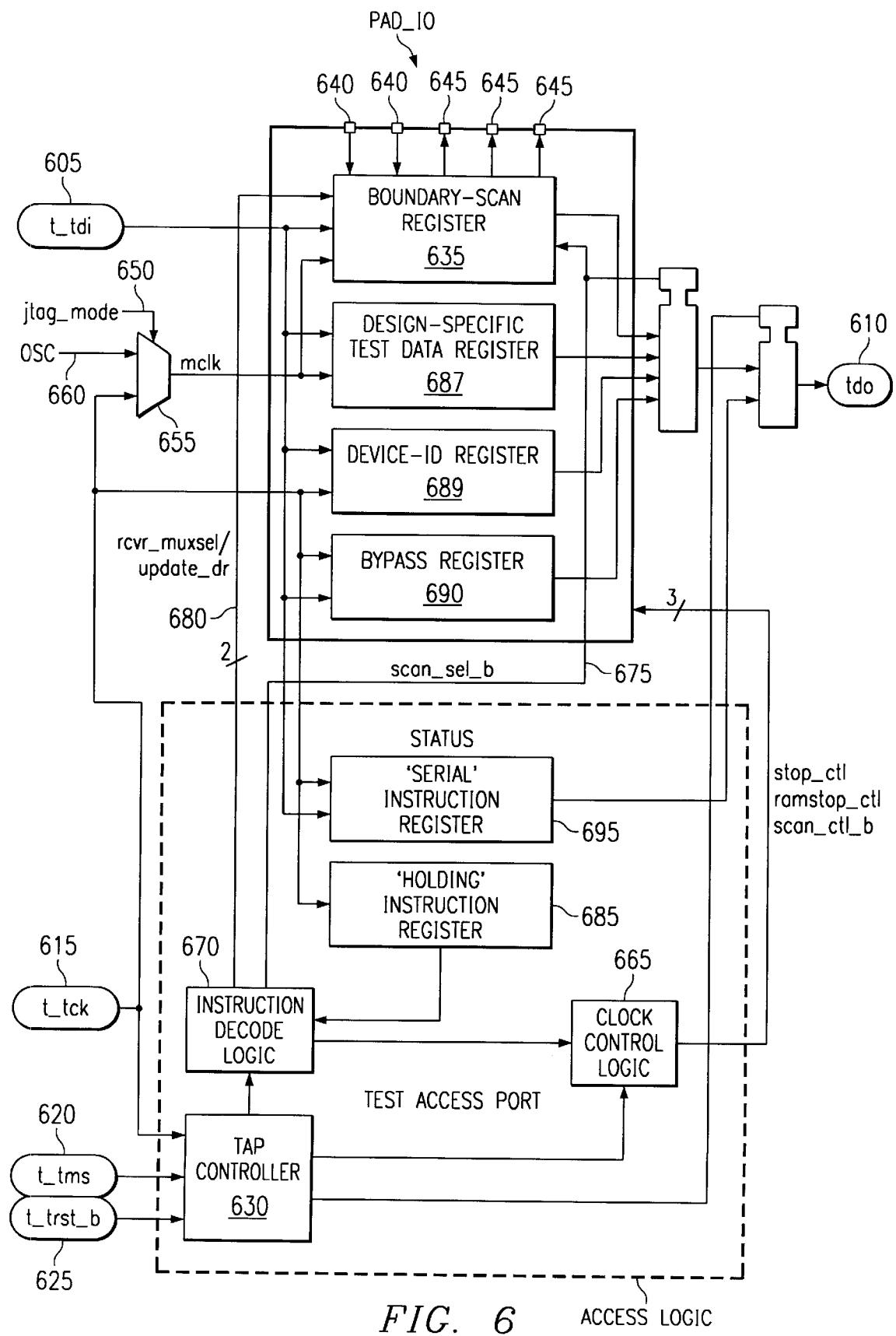
FIG. 6 is a block diagram of the architecture of the IEEE 1149.1 boundary scan standard used for implementing an embodiment of the present invention.

Referring now to FIG. 6, a block diagram of the architecture of the IEEE 1149.1 boundary scan standard used for implementing an embodiment of the present invention is illustrated. The 1149.1 standard defines a mandatory four-pin test access port (TAP) which may include an optional fifth pin. TAP signal pins include test data input (t_tdi) 605, test data output (tdo) 610, test clock (t_tck) 615, test mode select (t_tms) 620, and an optional asynchronous TAP reset (t_trst_b) 625.

The TAP controller 630 contains a 16-state finite-state machine (FSM) which is defined by the 1149.1 standard. The transitions of the TAP FSM are controlled by t_tms 620 and the dedicated test clock t_tck 615. The primary test data register defined by the 1149.1 standard is the boundary scan register 635 which contains individual boundary scan cells associated with each input pin 640 and each output pin 645 of the integrated circuit component. Both mandatory and permissible features of these individual boundary scan cells are defined by the 1149.1 standard. The input pins 640 and the output pins 645 are primary inputs to the chip package which are connected to another device on the circuit board. During boundary scan testing, the attached device may be configured to drive the pins 640 and 645 with a stable voltage level or the associated boundary scan cell may drive a stable signal to the pins.

When the boundary scan mode is entered, a control signal jtag_mode 650 is input to multiplexor 655 such that the free-running clock "OSC" 660 is disconnected from the H-tree clock distribution system 665 and the 1149.1 clock t_tck 615 is connected. This satisfies the requirement of the 1149.1 standard that only t_tck 615 be used to clock the devices in the integrated circuit when in the boundary scan mode. Clock Control Logic 665 is used to drive clock control signals stop_ctl, ramstop_ctl, and scan_ctl_b at the output of access logic 205 shown in FIG. 2. This allows the input ports to access logic 205 to be tested during boundary scan. As described above, the pipelines through which the clock control signals are distributed to the various devices on the chip create a delay which is several cycles of t_tck 615 depending on the number of latch pairs in the pipelines. Thus, the clock control signals stop_ctl, ramstop_ctl, and scan_ctl_b are driven to static values by clock control logic 665. Other control signals are then used to directly control the boundary scan devices.

Figure 7:
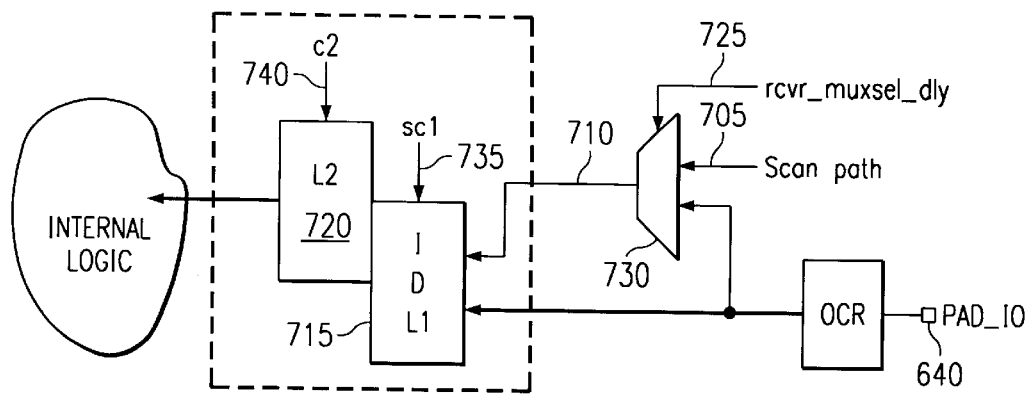
FIG. 7 is a boundary scan cell which may be implemented near each of the input ports 640.

In a preferred embodiment, stop_ctl=1, ramstop_ctl=1, and scan_ctl_b=0 in the boundary scan mode. Instruction decode logic 670 provides a unique control signal scan_sel_b 675 to each scannable register. Only the control signal 675 for boundary scan register 635 is shown in FIG. 6. In FIG. 6, boundary scan register 635, design specific test data register 687, device-id register 689 and bypass register 690 are all scannable registers. For example, during Extest and SAMPLE/PRELOAD boundary scan instructions, scan_sel_b 675 which is connected to the boundary scan register 635 is active. However, master-slave latches connected into other, non-boundary, scannable registers may be selected by other instructions when not in boundary scan mode. Control signal scan_sel_b 675 both selects the path for the selected register to drive tdo 610 and activates clock control sc1_scan_b for the local clock buffer driver of the selected register. When sc1_scan_b 675 is low at the local clock buffer, the scan clock sc1 is generated. The output sc1_scan_b from the local clock buffer driver is low one clock cycle after both the control signals into the local clock buffer driver scan_sel_b and scan_ctl_b are low. In a boundary scan-compliant mode of clock control operation, the global clock control, scan_ctl_b, which is distributed to all the local clock buffer drivers through the pipelined distribution tree, is set up in advance of scan_sel_b. This allows sc1_scan_b to be activated one clock cycle after scan_sel_b (now controlling the boundary scan register) is driven low on the transition into Capture-DR, given the instruction is EXTEST or SAMPLE/PRELOAD. Referring now to FIG. 7, a boundary scan cell which may be implemented near each of the input ports 640 is illustrated. This type of boundary cell is only required to receive signals from input port 640 when the system is in a functional mode. In boundary scan mode, a sequential scan chain is created by connecting a dedicated scan port "I" 710 on master latch "L1" 715 of the Nth flip/flop in the scan path 705 and is connected directly, i.e. without intervening functional logic, to the output of slave latch "L2" 720 of the (N−1)th flip flop in the scan path. This connection is made using control signal rcvr_muxsel_dly 725 received at multiplexor 730. This control signal is a latched version of rcvr_muxsel 680 from instruction decode logic 670. The signal rcvr_muxsel_dly 725 is latched and therefore delayed by one cycle of the clock t_tck 615 so that the signal arrives at the boundary scan cell in conjunction with the assertion of clock control signal sc1_scan_b which gates clock t_tck 615 to master latch L1 715. This is necessary because of the pipeline latch stage contained within the local clock buffer driver. The input to the scan port I 710 of the first latch in the scan path 705 is sourced from t_tdi 605. The scan or shifting of data into scan port I 710 is gated by scan clock sc1 735 from the nearest local clock buffer. When scan clock 735 is high, the value on scan port "I" 710 is loaded into master latch 715. Following sc1 going low, a c2 clock 740 must naturally occur to transfer the value loaded in the L1 latch into the slave latch L2 720. Ideally, sc1 735 and c2 740 should not both be high at the same time. If both were high at the same time, then input data would be flushed through the latch and there would be no control over the input data. The logic used to generate the sc1 clock signal is described below in reference to FIG. 10.

Figure 8:
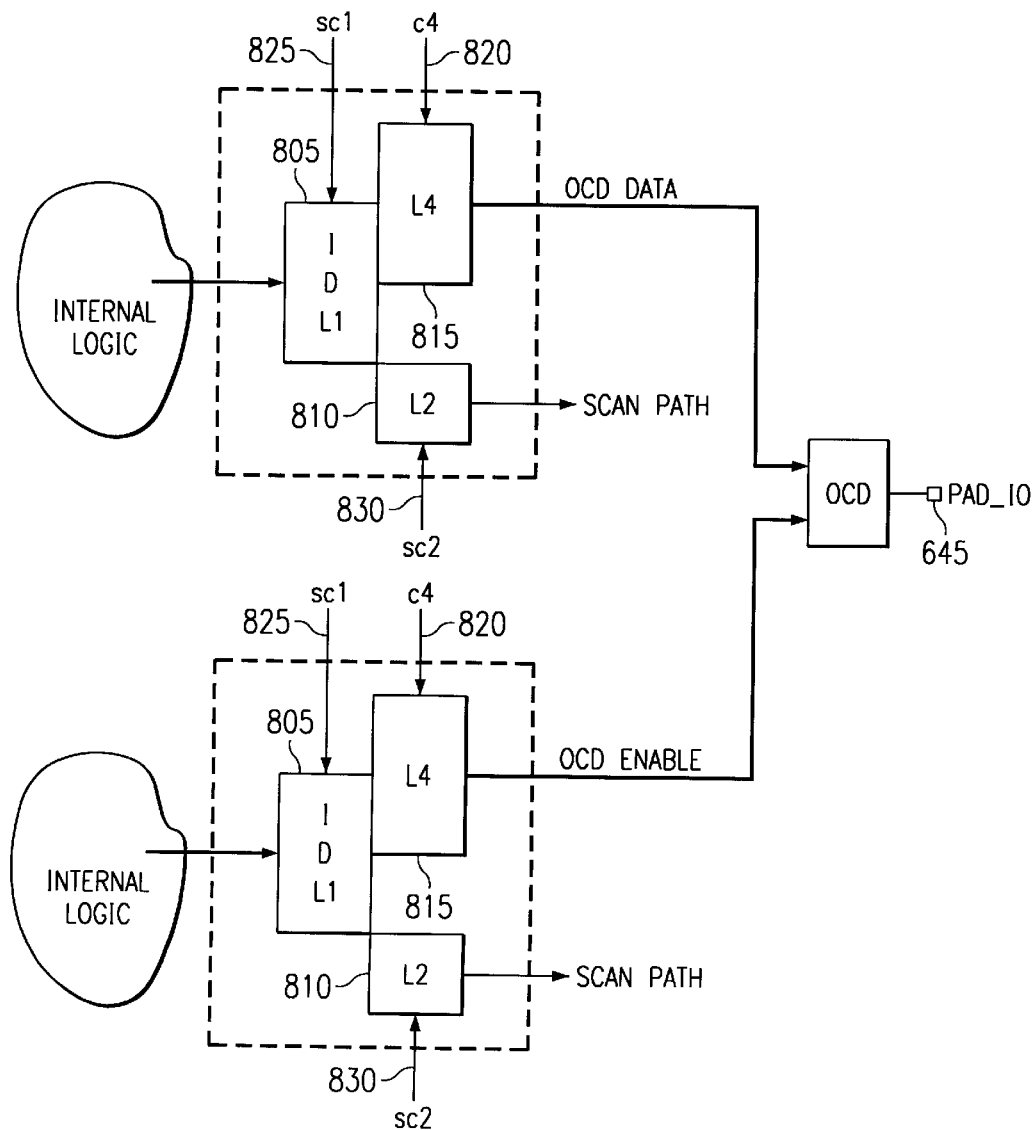
FIG. 8 is a boundary scan cell which may be implemented near each of the output ports 645.

Referring now to FIG. 8, a boundary scan cell which may be implemented near each of the output ports 645 is illustrated. This type of boundary cell is only required to drive signals from output port 645 when the system is in a functional mode. There are three latch stages: an "L1" master latch 805, an "L2" scan-only latch 810, and an "L4" functional non-scan slave latch 815. The L4 latch drives the data and an enable signal to an on chip driver (OCD). The boundary cells are connected together in the scan path depending on the path selected by the designer. Also, latches not connected to an input/output pin may also be included, though this is not done in the preferred embodiment. The clock signal c4 820 drives the functional L4 latch 815 and is thus shut off during boundary scan. The sc1 clock 825 drives master latches L1 and sc2 drives slave latches L2.

Traditional boundary scan cell design place a multiplexor between the functional data latch (not necessarily in the boundary scan chain), and a separate dedicated boundary scan latch. Of course this multiplexor introduces delay into the data path out of the chip. IEEE 1149.1 requires that the chip outputs remain constant during boundary scan until state update_dr is entered. Three latches are used as shown here to avoid delay in the functional data path. The third latch, i.e. L4 815, allows the functional data path to drive the OCD directly from a latch while still being able to hold the output data constant during the shifting of the boundary scan register. The L2 is used only for the shifting operation.

Figure 9:
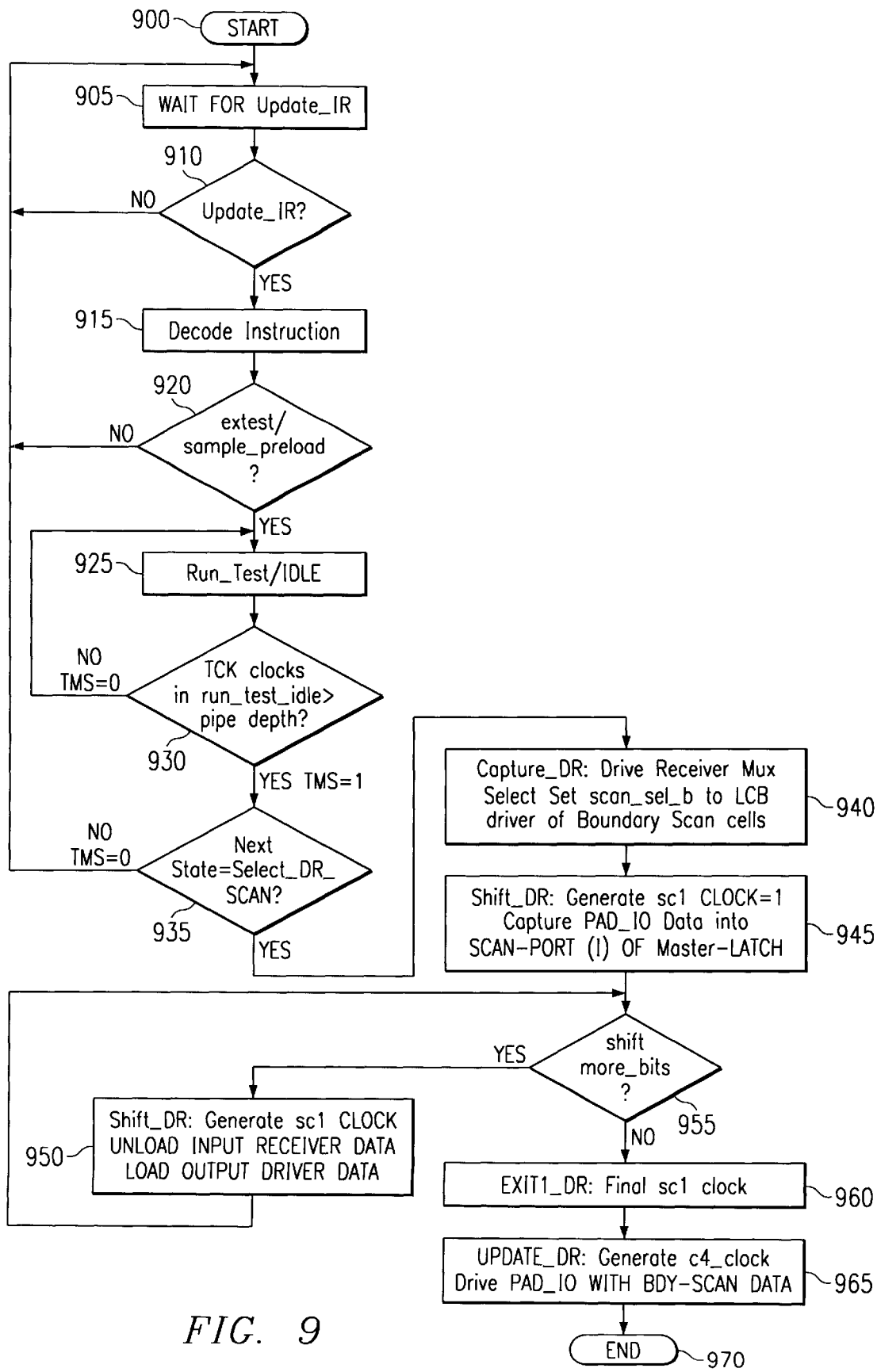
FIG. 9 is a flowchart for a boundary scan mode of operation of a preferred embodiment.

Referring now to FIG. 9, a flowchart for a boundary scan mode of operation of a preferred embodiment is illustrated. Beginning at step 900, the boundary scan mode is entered. The pipelining of the clock control signals as described above does not create a problem for complying with 1149.1 until TAP controller 630 enters state Update-IR. Thus, at step 905 clock control logic 665 monitors TAP controller 630 for an Update-IR state. When state Update-IR is entered at step 910, an instruction is shifted from holding instruction register 685 into instruction decode logic 670 and the instruction is decoded at step 915. If the decoded instruction is "extest" or "sample_preload," which are defined in 1149.1, then the clock control logic 665 enables the procedure for IEEE 1149.1 compliant Boundary Scan.

The first actions of the clock control logic 665 are to force the multiplexor select that causes the TCK clock to source the clock H-tree and to force the inputs to the clock control pipeline to constant levels: stop_ctl=1, ramstop_ctl=1, and scan_ctl_b=0. If the decoded instruction is not one of these instructions, then clock control logic 665 returns to monitoring for an Update-IR state at step 905. Otherwise, TAP Controller 630 is held in state Run-Test/Idle for a minimum number of clock cycles of t_tck 615, which are counted at step 930. When t_tck 615 is clocked for a number of cycles which is greater than the number of latch pairs in the clock control signal pipeline, the clock control pipeline latches are ready for boundary scan operations. TAP controller 630 may then proceed to state Select-DR-Scan at step 935 and then to the next state Capture-DR at step 940. Note that if the DR (data-register) leg of the TAPstate machine is skipped and the Select-IR-Scan state is entered at step 935, then the clock control logic returns to monitoring the TAP controller at step 905.

When TAP controller 630 enters stateCapture-DR, rcvr_muxsel 680 is driven high to all the multiplexors 730 feeding scan port 710 of the boundary scan latches associated with a chip input port 640. Also, while in state Capture-DR scan_sel_b is driven low to the local clock buffer drivers belonging to the boundary latches. This results in an sc1 clock in the next cycle, which is the next state, Shift-DR, entered at step 945.

During state Shift-DR, the sc1 clock is generated to capture the data from the input or output pin into the scan port "I" of the boundary scan latch. Note that during this state rcvr_muxsel_dly 725 is logically high. An sc1 clock is gated to all of the boundary latches in the boundary scan register at the same time. If more than one bit needs to be shifted, then the TAP controller remains in state Shift-DR and the input receiver data is unloaded and the output driver data is loaded. Receiver data refers to the signals at the chip inputs, or receivers, that have been captured on a master latch by the sc1 clock pulse.

With each subsequent sc1 clock pulse generated by Shift-DR, a bit of data from the boundary scan register is shifted out of the tdo pin 610, a process referred to as "unloading." With the same sc1 clock, data from the t_tdi 605 is clocked into the boundary scan register, a process referred to as "loading." Once all the bits are shifted, the TAP controller enters state Exit1-DR at step 960. In this state, one final sc1 clock is generated. Then at step 965, state Update-DR is entered where a c4 clock is generated to clock the functional latch L4 815 in order to drive the boundary scan data to the output port.

The pipelining of clock control signals described above is necessary for the high speed clock interfacing. However, if not for the scheme presented for clocking boundary scan latches, the scheme would not be in compliance with the IEEE 1149.1 boundary scan standard. Because scanning is an essential part of boundary scan, the pipeline is preconfigured to a scan mode by loading the pipeline during state Run/Test-Idle, thus rendering transparent the effects of the pipeline. Using this method, the only clock available to capture the chip inputs is the sc1 scan clock because all the other clocks are turned off by the pipelined clock control signals. Therefore, the chip input data must enter the boundary latch through the scan port. The scan_sel_b signal is essentially used as an enable for the sc1 clock. Though the final pipeline latch stage in the local clock buffer is not pre-configured, it is only one latch stage deep and thus the trailing effect of an sc1 clock during state Exit-DR does not encroach into the Update-DR state.

During state Update-DR the blocking of functional clock c4 is released so that the functional latches which source the chip outputs change to reflect the data set into master latch L1 of the corresponding boundary latch. The transition occurs precisely in state UPDATE-DR as required by the standard. Using a latch to drive the outputs eliminates the need for a mux between the functional output latch and a separate boundary scan latch, which is important for timing critical signals.

Figure 10:
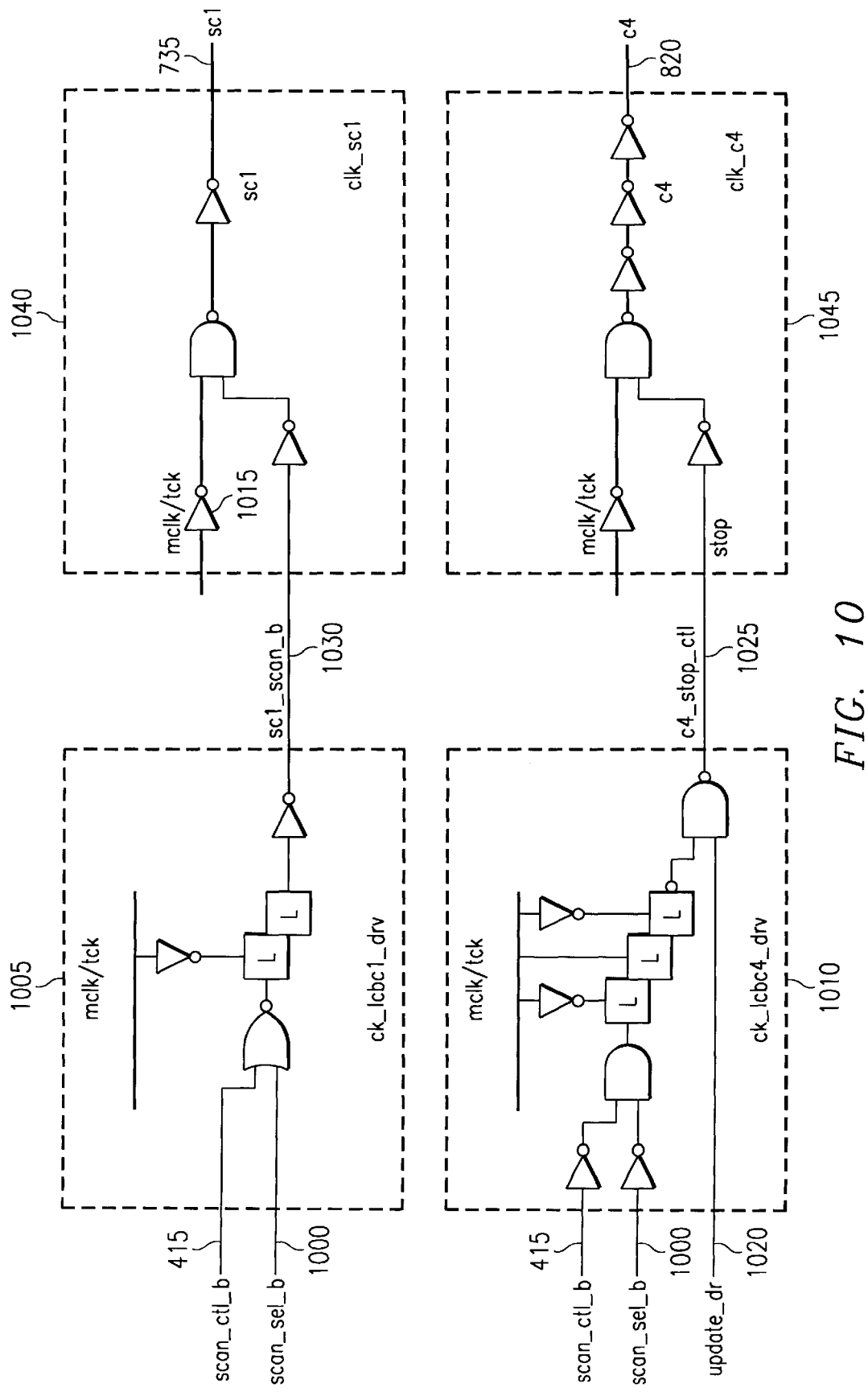
FIG. 10 is a schematic diagram of a pair of local clock buffer drivers and local clock buffers.

Referring now to FIG. 10, a schematic diagram of a pair of local clock buffer drivers and local clock buffers are illustrated. Clock control scan_ctl_b 415 and scan_sel_b 1000 are used in both local clock buffer drivers 1005, 1010 which generate clock sc1 735 and clock c4 820 (described previously) through local clock buffers 1040, 1045. The control scan_ctl_b 415 is a pipelined control signal and is thus driven to a static value of 0 before state Select-DR-Scan is entered by TAP Controller 630. Thus, during boundary scan mode, scan_sel_b 1000 is the control signal which is used to gate the test clock 1015 to clock sc1 735 and clock c4 820. However, note that local clock buffer driver 1010 for clock c4 820 also contains a control signal update_dr 1020. During the functional mode of operation, update_dr 1020 is normally set to a logical 1 and thus has no effect on the gating of clock c4 820. However, during boundary scan mode, update_dr is set to a logical 0. This makes c4_stop_ctl 1025 equal to a logical 1 and thus shuts off the c4 clock 820 to functional boundary output latch L4 815. Depending on the value of sc1_scan_b 1030 and c4_stop_ctl 1025, the test clock 1015 is gated to sc1 735 and c4 820.

Figure 11:
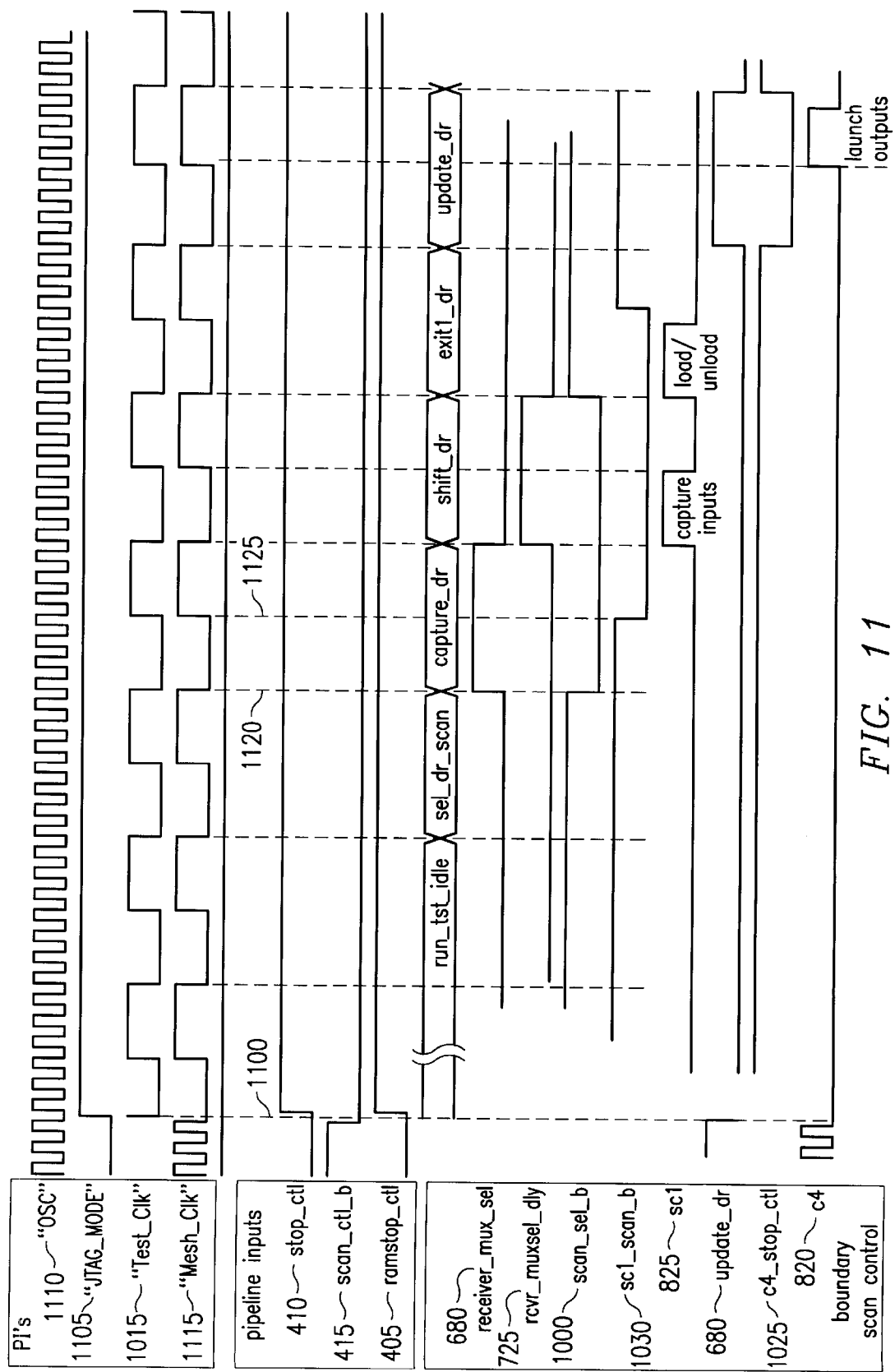
FIG. 11 is a timing diagram of the boundary scan mode of operation.

Referring now to FIG. 11, a timing diagram of the boundary scan mode of operation is illustrated for a preferred embodiment. Beginning at time 1100, the scan mode is entered by asserting jtag_mode 1105. This disconnects the free-running oscillator 1110 from the mesh clock H-tree distribution system 1115. At the same time, the inputs to the pipeline control signals stop_ctl 410, scan_ctl_b 415, and ramstop_ctl 405 are driven to static values: stop_ctl=1, scan_ctl_b=0, and ramstop_ctl=1. TAP Controller 630 then enters state Run-Test/Idle until the pipeline inputs have had enough time to propagate through the pipeline stages to the local clock buffer drivers. The number of cycles of test clock 1015 required for pipeline inputs to propagate through the pipeline is determined by the number of latch stages that are present in the pipeline.

TAP Controller is held in state Run-Test/Idle for at least the number of cycles of test clock 1015 which is equal to the number of latch stages in the pipeline. After the pipeline is pre-configured in this manner, TAP Controller enters state Select-DR-Scan. One cycle of test clock 1015 later at time 1120 TAP Controller enters the state Capture-DR. When the controller enters this state, rcvr_muxsel 680 is asserted. It is asserted one cycle before state Shift-DR because of a pipeline latch stage between rcvr_muxsel 680 and rcvr_muxsel_dly 725. Control signal scan_sel_b 1000 is also asserted upon entering state Capture-DR. This causes a falling edge on sc1_scan_b 1030 at time 1125. This causes an output on sc1 825 which is inverse to test clock 1015, resulting in the inputs being captured to the boundary latch. The TAP Controller then goes to the next state Shift-DR where rcvr_muxsel 680 is deasserted. Control rcvr_muxsel_dly 720 is asserted beginning at Shift-DR because of the delay created by the pipeline latch stage. This causes the input to be captured in the scan port. The controller then moves into state Exit1-DR.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application and to enable others of ordinary skill in the art to understand the invention for various embodiments with various modifications as are suited to the particular use contemplated.

What is claimed is:

1. A method for distributing a clock control signal on an integrated circuit during a boundary scan mode of operation, comprising the following steps:

driving inputs to a clock control pipeline to a static scan state;

clocking a plurality of latch pairs in the clock control pipeline for a number of cycles at least equal to a number of the plurality of latch pairs in the pipeline; and gating a test clock driving a clock mesh to a scan latch using a scan enable signal input to a local clock buffer driver wherein the scan enable signal is controlled by an instruction decoder.

2. The method of claim 1 wherein during a capture state, data is captured from a port of the integrated circuit to a scan port of the scan latch.

3. The method of claim 1 wherein the method complies with IEEE 1149.1.

4. A method for distributing a clock control signal on an integrated circuit during a boundary scan mode of operation, comprising the following steps:

monitoring for an Update-IR state;

determining whether a decoded instruction is a boundary scan operation upon entering the Update-IR state;

entering a Run-Test/Idle state when the decoded instruction is determined to be a boundary scan operation;

remaining in the Run-Test/Idle state until a number of test clock cycles have elapsed wherein the number of test clock cycles is greater than a number of pipeline stages in a clock control signal pipeline;

asserting a receiver multiplexor selector upon entering a state Capture-DR;

gating a test clock to a master latch of a boundary scan cell upon entering a state Shift-DR such that data on a port of the integrated circuit is captured into a scan port of a latch of the boundary scan cell; and gating a test clock to a functional latch in the boundary scan cell during an Update-DR state to drive the port of the integrated circuit with data from the boundary scan cell.

5. A system for distributing a clock control signal on an integrated circuit during a boundary scan mode of operation comprising:

a means for driving inputs to a clock control pipeline to a static scan state;

a means for clocking a plurality of latch pairs in the clock control pipeline for a number of cycles at least equal to a number of the plurality of latch pairs in the pipeline; and a means for gating a test clock driving a clock mesh to a scan latch using a scan enable signal input to a local clock buffer driver wherein the scan enable signal is controlled by an instruction decoder.

6. The system of claim 5 further comprising:

a means for determining whether a decoded instruction is a boundary scan operation upon entering an Update-IR state;

a means for entering a Run-Test/Idle state when the decoded instruction is determined to be a boundary scan operation;

a means for remaining in the Run-Test/Idle state until a number of test clock cycles have elapsed wherein the number of test clock cycles is greater than a number of pipeline stages in a clock control signal pipeline;

a means for gating a test clock to a master latch of a boundary scan cell upon entering a state Shift-DR such that data on a port of the integrated circuit is captured into a scan port of a latch of the boundary scan cell; and a means for gating a test clock to a functional latch in the boundary scan cell during an Update-DR state to drive the port of the integrated circuit with data from the boundary scan cell.

7. The system of claim 6 wherein the system complies with IEEE 1149.1 boundary scan standard.

8. The system of claim 7 further comprsing a means for monitoring for an Update-IR state.

9. The system of claim 8 further comprising a means for asserting a receiver multiplexor selector upon entering a state Capture-DR.

\* \* \* \* \*